(12) United States Patent
Hainisch et al.

(10) Patent No.: US 11,573,131 B2
(45) Date of Patent: Feb. 7, 2023

(54) MEMS STRUCTURE AND METHOD FOR DETECTING A CHANGE IN A PARAMETER

(71) Applicant: Infineon Technologies AG, Neubiberg (DE)

(72) Inventors: Reinhard Hainisch, Klagenfurt (AT); Thomas Grille, Villach (AT)

(73) Assignee: Infineon Technologies AG, Neubiberg (DE)

( * ) Notice: Subject to any disclaimer, the term of this patent is extended or adjusted under 35 U.S.C. 154(b) by 928 days.

(21) Appl. No.: 16/406,752

(22) Filed: May 8, 2019

(65) Prior Publication Data

US 2019/0346314 A1    Nov. 14, 2019

(30) Foreign Application Priority Data

May 9, 2018    (DE) .......................... 102018207319.8

(51) Int. Cl.
*B81B 3/00* (2006.01)
*G01K 5/48* (2006.01)
*G01K 5/54* (2006.01)

(52) U.S. Cl.
CPC ............ *G01K 5/486* (2013.01); *B81B 3/0024* (2013.01); *G01K 5/54* (2013.01); *B81B 2201/0278* (2013.01); *B81B 2203/0118* (2013.01)

(58) Field of Classification Search
CPC .................................................. B81B 3/0024
See application file for complete search history.

(56) References Cited

U.S. PATENT DOCUMENTS

| 5,966,066 A * | 10/1999 | Mehregany ......... G01P 15/0802 337/14 |
| 7,159,442 B1 | 1/2007 | Jean |
| 2003/0067959 A1* | 4/2003 | Buehrlen ............... G01K 11/06 374/E11.006 |
| 2005/0146404 A1 | 7/2005 | Yeatman |
| 2005/0189204 A1 | 9/2005 | Yeatman et al. |
| 2007/0125961 A1 | 6/2007 | Despont |
| 2009/0219128 A1 | 9/2009 | Elliott et al. |
| 2017/0102249 A1* | 4/2017 | Yazdi ..................... G01D 5/251 |

OTHER PUBLICATIONS

German Patent Office, Office Action issued for DE 102018207319.8, 5 pgs., dated Jul. 23, 2018.
Office Action dated Sep. 2, 2020 for German Patent Application No. 102018207319.8.

* cited by examiner

*Primary Examiner* — Moazzam Hossain
(74) *Attorney, Agent, or Firm* — Banner & Witcoff Ltd.

(57) ABSTRACT

A MEMS structure including a latch, a first lever, and a second lever. The first lever is designed to move past the latch as a result of flexure in the event of a change in a parameter in a first direction, and to latch in place at the latch if a change in the parameter in a second direction different than the first direction subsequently takes place. The second lever is designed to move past the first lever as a result of flexure in the event of the change in the parameter in the second direction, and to latch in place at the first lever if a change in the parameter in the first direction takes place after the change in the parameter in the second direction.

18 Claims, 9 Drawing Sheets

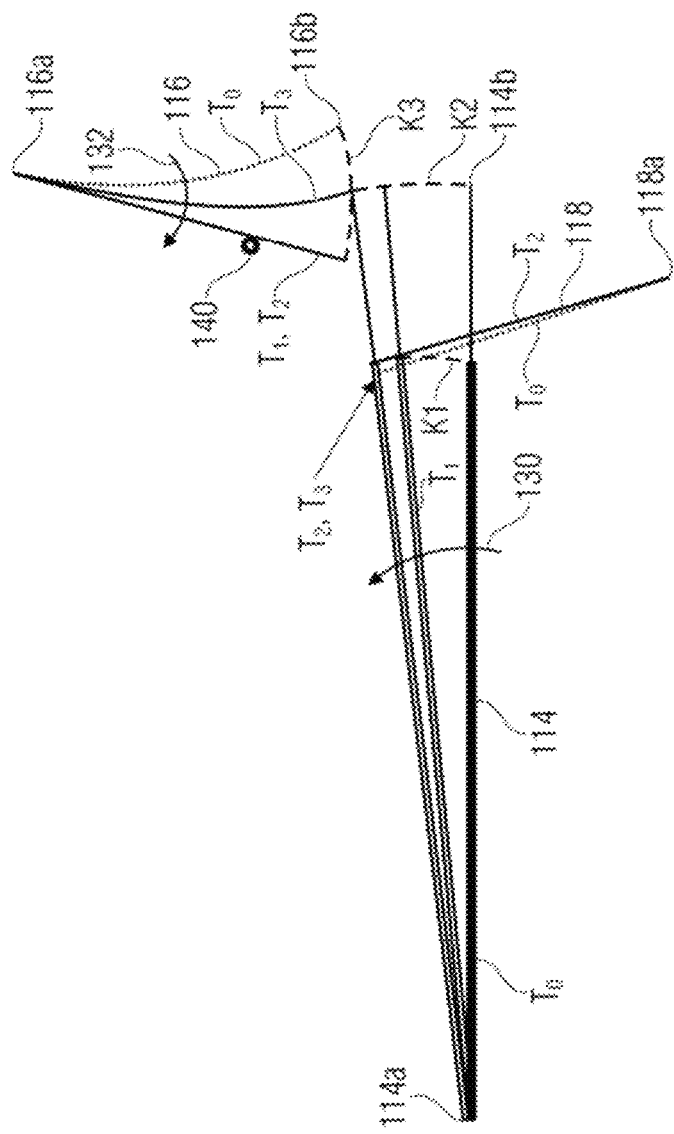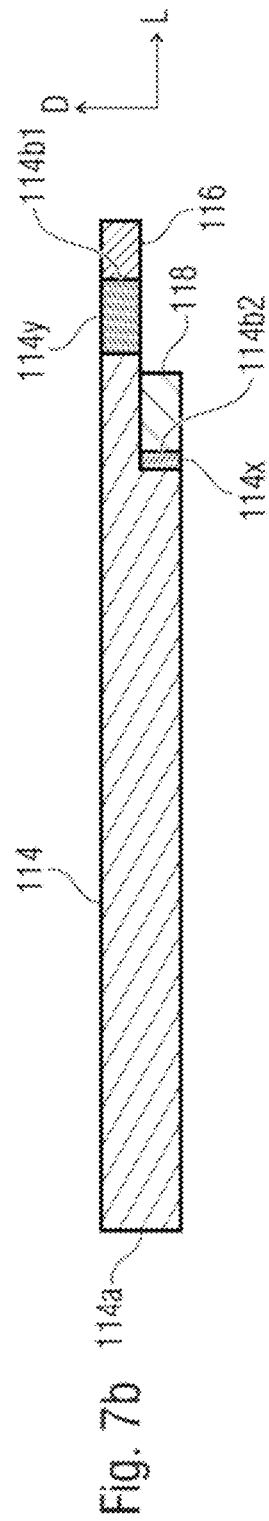

MEMS STRUCTURE AND METHOD FOR DETECTING A CHANGE IN A PARAMETER

TECHNICAL FIELD

The present disclosure is concerned with MEMS structures and methods which make it possible to detect a change in a parameter, in particular a physical parameter, such as temperature, for example.

BACKGROUND

It may often be desirable to detect specific events associated with a change in a physical or chemical parameter. By way of example MEMS temperature storage sensors are known, comprising a latching mechanism consisting of two overlapping levers produced using IC processing and silicon micromachining techniques. One lever consists of $p^+$-type silicon, and the other consists of polysilicon. After production, the levers can be brought to a latched state at room temperature using a probe tip, the levers being latched in place relative to one another in said latched state. If the temperature is reduced below a specific threshold value, the levers are released from the latched state, such that the element no longer returns to the blocked state even if the temperature changes again to room temperature. The event that the temperature had fallen below the threshold value can thus be detected.

OVERVIEW

In certain applications it may be desirable to detect events, such as the contravention of a cold chain, for example. Such events should preferably be able to be detected without power. There is thus a need for devices and methods which make it possible to detect whether a parameter has not exceeded a specific width region.

Examples of the present disclosure provide a MEMS structure comprising a latch, a first lever and a second lever. The first lever is designed to move past the latch as a result of flexure in the event of a change in a parameter in a first direction and to latch in place at the latch if a change in the parameter in a second direction different than the first direction subsequently takes place. The second lever is designed to move past the first lever as a result of flexure in the event of the change in the parameter in the second direction and to latch in place at the first lever if a change in the parameter in the first direction takes place after the change in the parameter in the second direction.

Examples of the present disclosure thus make it possible for the first lever to be brought into a predetermined state, namely the state latched in place at the latch, if a change in the parameter in a first direction beyond a limit value takes place, for example if cooling below a specific limit temperature takes place after production. The first lever can latch in place at the latch irreversibly if the parameter changes in a second direction different than the first direction. In the event of this change in the parameter in the second direction beyond a second limit value, for example heating above a second limit temperature, the second lever can move past the first lever. If cooling below the second limit temperature then takes place once again, the second lever latches in place at the first lever irreversibly and cannot return to the position which it would otherwise assume in the event of cooling below the second limit temperature. Consequently, in examples of the present disclosure, it can be identified that a predetermined parameter, for example a temperature, was not maintained continuously below a limit value, for example a limit temperature.

In examples of the present application, the parameter is the temperature, and the first lever and the second lever each comprise at least two material layers designed to flex in the event of changes in the temperature. A corresponding MEMS structure can thus be implemented in a simple manner, for example in a semiconductor substrate.

In examples of the present disclosure, the first lever has a first section and a second section, wherein the first section is designed to latch in place at the latch, and wherein the second lever is designed to latch in place at the second section of the first lever. It is thus possible to implement both the latching in place of the first lever at the latch and the latching in place of the second lever at the first lever.

In examples, the first and second levers are designed to flex in a direction perpendicular to a substrate plane of a substrate in which the MEMS structure is formed. In such examples, the first section can be arranged in a first width region of the first lever and the second section can be arranged in a second width region of the first lever. In order not to disturb a movement of the first lever by the latch, in examples the latch does not extend beyond the first width region of the first lever.

In examples of the present disclosure, the first and second levers are designed to flex in a direction parallel to a substrate plane of a substrate in which the MEMS structure is formed. In such examples, the first lever can have a thickness that is greater than a thickness of the second lever, wherein the first lever and the second lever are arranged at an angle with respect to one another, wherein a first section of the first lever, which is designed to latch in place at the latch, is arranged in a first thickness region of the first lever and a second section of the first lever, at which the second lever latches in place, is arranged in a second thickness region of the first lever. In such examples, the latch can extend below the second thickness region of the first lever.

Examples of the present disclosure thus make possible, in a flexible manner, different arrangements of the first and second levers relative to a substrate in which the MEMS structure is formed.

In examples of the present disclosure, the first and second sections of the first lever can have identical or different lengths, wherein the lengths of the first and second sections are adapted in order to cooperate respectively with the latch and the second lever in order to implement the respective latching functionalities.

In examples of the present disclosure, the latch can have an elastic latching lever, wherein a free end of the latching lever is deflectable from an initial position by the first lever if the first lever moves past the latch as a result of the change in the parameter in the first direction, wherein its elasticity brings the latching lever into the initial position again if the first lever has moved past, such that the first lever latches in place on the free end of the latching lever if the change in the parameter in the second direction different than the first direction subsequently takes place. Examples of the present disclosure thus enable the first lever to latch in place securely at the latch.

In examples of the present disclosure, the latch has a sliding surface which leads to a latching end of the latch and along which the first section of the first lever slides if the first lever moves past the latch in the event of the change in the parameter in the first direction, wherein the first lever latches in place at the latching end if the change in the parameter in the second direction different than the first direction subsequently takes place. Examples thus make it possible to implement a rigid latch which makes it possible for the first lever to pass the latch if it moves in a first direction, and which makes it possible for the first lever to latch in place if it moves in a second direction.

In examples, the MEMS structure comprises an electrical circuit, wherein a detectable property of the electrical circuit is altered as a result of the second lever latching in place at the first lever. In examples of the present disclosure, it is thus possible to establish by means of electrical read-out whether a corresponding change in the parameter in the second direction has taken place. In examples, the MEMS structure can comprise an electrical switch that is closed if the second lever latches in place at the first lever. In examples, the electrical circuit can comprise a radio-frequency resonant circuit, wherein the detectable property is the resonant frequency of the radio-frequency resonant circuit. In examples, the electrical circuit can comprise a surface acoustic wave filter, wherein the electrical property is a changed response behavior of the surface acoustic wave filter. Examples of the present disclosure provide an RFID tag comprising a MEMS structure as described herein, wherein a bit of the RFID tag is irreversibly switched if the second lever latches in place at the first lever. Examples thus enable a simple read-out using an RFID reader.

Examples of the present disclosure provide a method for detecting a change in a parameter, wherein a first lever is flexed in order to move past a latch if the parameter changes in a first direction beyond a first limit value. The first lever is latched in place at the latch if the parameter subsequently changes in a second direction different than the first direction. The second lever is flexed in order to move past the first lever if the parameter changes in the second direction beyond a second limit value. The second lever is latched in place at the first lever if the parameter changes in the first direction after the change in the second direction.

BRIEF DESCRIPTION OF THE DRAWINGS

Examples of the present disclosure are explained in greater detail below with reference to the accompanying drawings, in which:

FIG. 7a shows a schematic plan view illustration for elucidating the operation of the example shown in FIG. 6;

FIG. 7b shows a schematic side view of the example shown in FIG. 6;

DETAILED DESCRIPTION

Figure 1A:
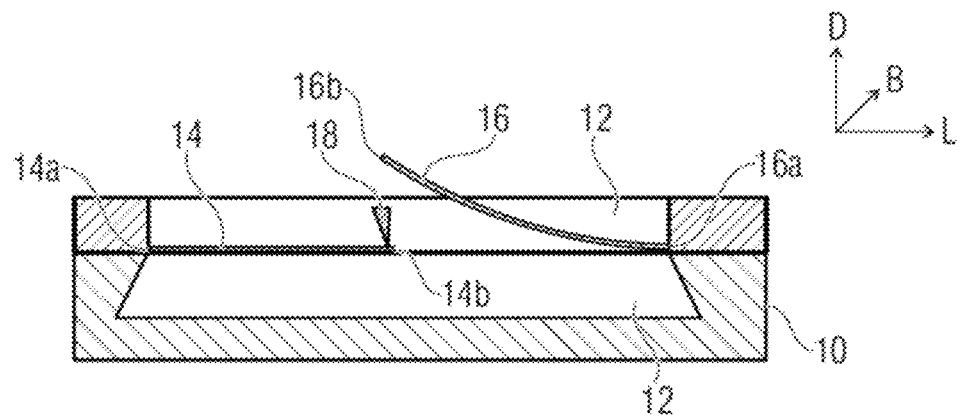
FIGS. 1a-1d show schematic illustrations of one example of a MEMS structure in different phases of operation.

Examples of the present disclosure are described in detail below using the accompanying drawings. It is pointed out that in the drawings, identical elements or elements having an identical functionality can be provided with identical or similar reference signs, wherein a repeated description of such elements can be omitted. Therefore, descriptions for elements having identical or similar reference signs can be mutually interchangeable.

The following description sets out a plurality of details in order to afford a thorough explanation of examples of the present disclosure. However, it will be apparent to those skilled in the art that examples of the present disclosure can be practiced without these specific details. In other cases, sufficiently known structures and devices are shown in schematic cross-sectional view or plan view instead of in details, in order not to obfuscate the description of examples. Moreover, features of the various examples described hereafter can be combined with other features of other examples, unless expressly indicated otherwise herein.

Examples of the present disclosure relate to MEMS structures. A MEMS structure should be understood to mean a structure, for example an element, of a microelectromechanical system. A microelectromechanical system should be understood to mean, in particular, a system which can be produced using process technologies that find application in semiconductor technology. In this case, in particular, deposition of material layers, patterning by photolithography and etching in order to produce the required shapes can be regarded as elementary techniques. MEMS structures can be implemented in particular using semiconductor materials, for example silicon. Alternatively, MEMS structures can furthermore be produced from polymer materials by processes such as e.g. injection molding, embossing or stereolithography. Metal and ceramic materials can find application in corresponding methods for producing MEMS structures.

FIG. 1a shows a schematic cross-sectional view of a MEMS structure in accordance with one example of the present disclosure. The MEMS structure is formed in a substrate 10. The substrate 10 can be a semiconductor substrate, which can comprise a multiplicity of layers, for example semiconductor layers, oxide layers, metal layers and the like. Generally, the substrate 10 can have two main surfaces, the extent of which is greater than that of the other surfaces connecting the two main surfaces. In the example shown in FIG. 1a, by way of example, the top side and the underside constitute the main surfaces. The main surfaces can be parallel to one another. A substrate plane is defined by at least one of these main surfaces, wherein a thickness direction is perpendicular to the substrate plane and an length direction and a width direction are parallel to the substrate plane.

Figure 2:
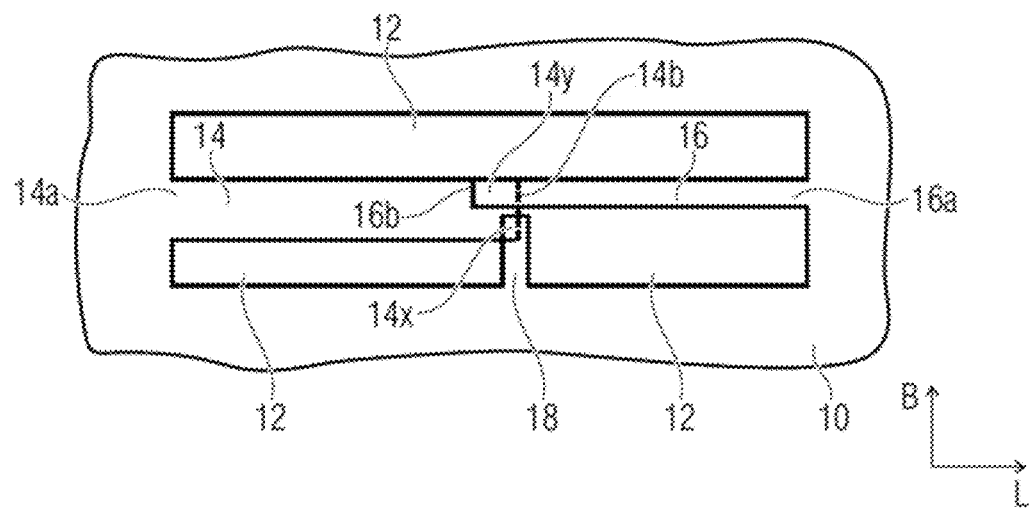
FIG. 2 shows a schematic illustration of a plan view of the example of a MEMS structure as shown in FIGS. 1a-1d.

As can be discerned in FIGS. 1a and 2, the substrate 10 has cavities 12, by means of which a first lever 14, a second lever 16 and a latch 18 are defined. The first lever 14, the second lever 16 and the latch 18 can be formed in different layers of the substrate 10, even though this is not explicitly illustrated in the figures.

The first lever 14 is fixed to the substrate 10 at a first end 14a of said lever. The second lever 16 is fixed to the substrate 10 at a first end 16a of said lever. The first lever 14 and the second lever 16 each have a length and a width. The levers are elongate, i.e. a length thereof between the fixed end and the free end thereof is greater than the width thereof. The width of the first lever 14 is greater than the width of the second lever 16. The length direction of the first lever and the length direction of the second lever 16 can be substantially parallel to one another. A second end 14b of the first lever 14, said second end being at a distance from the first end 14a, is movable, and an end 16b of the second lever, said end being at a distance from the first end 16a of the second lever 16, is movable. The latch 18 can be a rigid latch fixed to the substrate 10. In examples, the latch 18 can be implemented as a rigid hook.

In examples of the present disclosure, the second lever 16 can be formed in one or a plurality of material layers of the substrate 10 which lie in the thickness direction above one or a plurality of material layers of the substrate in which the first lever 14 is formed.

Figure 4A:
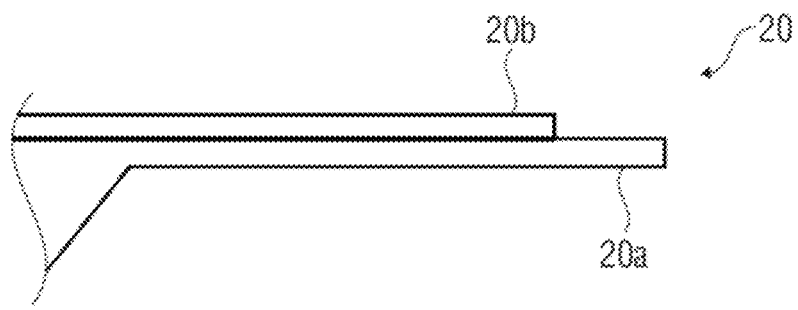
FIGS. 4a and 4b show schematic cross-sectional views of lever structures.

In examples of the disclosure, the first lever 14 and the second lever 16 can each comprise at least two material layers in order to exhibit the behavior described below in the event of temperature changes. In examples, the material layers can consist of different materials having a different coefficient of thermal expansion in order to exhibit the corresponding behavior. By way of example, FIG. 4a schematically shows a cross-sectional view of a lever 20 comprising a first material layer 20a and a second material layer 20b. The first material layer 20a can consist of polysilicon or silicon oxide, for example, and the second material layer can consist of silicon nitride, for example. Depending on which material layer has the greater coefficient of linear thermal expansion, the free end of the lever moves upward or downward in the event of heating or cooling. By way of example, if the material 20a has a greater coefficient of linear expansion than the material 20b, the lever 20 would flex upward in the event of a temperature increase. Corresponding structures are known as MEMS bimetal structures to those skilled in the art, wherein the respective material layers need not consist of metal, but rather can consist of other materials having different coefficients of linear expansion. In exemplary embodiments, one or a plurality of the material layers can consist of a doped monocrystalline or polycrystalline semiconductor material. In exemplary embodiments, one or a plurality of the material layers can have a doping pattern in a semiconductor material, i.e. zones of different doping. In this case, one or a plurality of the material layers can have zones of different doping in a direction perpendicular to the substrate plane and/or parallel to the substrate plane. As a result, different flexure shapes can be attained, for example an S-shaped flexure. In exemplary embodiments, this can assist the movement of the second lever past the first lever.

Figure 4B:
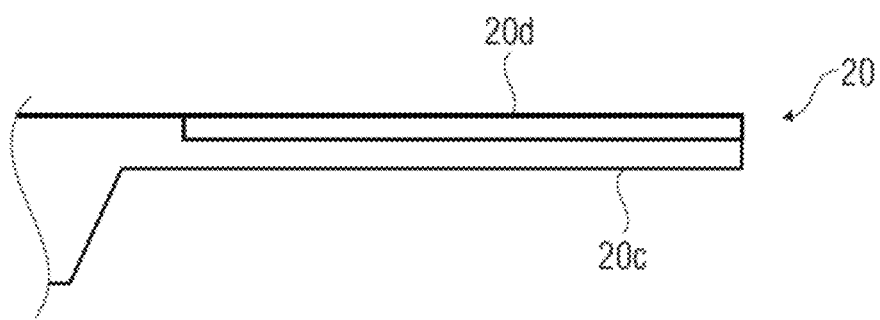

FIG. 4b shows an alternative implementation, wherein a lever 20 is formed from a semiconductor material 20c having a doped region 20d. By way of example, the material 20c can be a polycrystalline semiconductor material, e.g. polysilicon, while the implanted region 20d can be a heavily p-doped region of the semiconductor material. Since the coefficient of linear expansion of the polycrystalline semiconductor material is higher than that of the material of the heavily implanted region 20d, the lever shown in FIG. 4b would flex upward in the event of a temperature increase and would flex downward in the event of a temperature decrease. Analogously, a lever could also be implemented in which an implantation is formed in the lower surface, such that the lever would flex downward in the event of a temperature increase and would flex upward in the event of a temperature decrease.

FIG. 1a shows the MEMS structure after or during production at room temperature of, for example, 20° C. or 25° C. The length direction L, the width direction B and the thickness direction D are represented by respective arrows. As is shown in FIG. 2, the first lever 14 has a first section 14x in the width direction B, said first section being designed to latch in place at the latch 18. Furthermore, the first lever 14 has a second section 14y in the width direction B, the second lever 16 latching in place at said second section. In the example shown, the first section 14x and the second section 14y are arranged alongside one another in the width direction. As can be discerned in FIG. 2, the latch 18 does not extend beyond the width region of the first lever 14 in which the first section 14x is formed, such that the second lever 16 can be moved past the latch 18 freely without limitations. To put it another way, the latch 18 does not disturb a movement path of the second lever 16. The first lever is produced in such a way that it is in the neutral position shown in FIG. 1a at room temperature. In the neutral position, said first lever is not flexed as a result of thermally induced stresses. The second lever 16 is formed from a material combination such that it is in the bent position shown in FIG. 1 at room temperature on account of intrinsic stresses.

Proceeding from this state, the sensor can be activated by the temperature being reduced to a specific temperature below a first limit temperature, for example −15° C. The first limit temperature can thus be a temperature upon the exceedance of which an activation of the MEMS structure takes place.

Figure 1B:
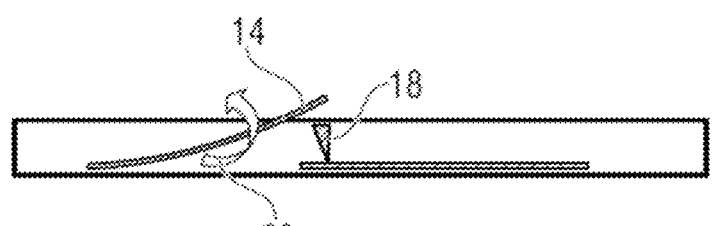

The first lever 14 is configured to flex upward in the event of a temperature decrease, as is shown by an arrow 30 in FIG. 1b. The first lever 14 and the latch 18 are configured in such a way that the first lever 14 can pass the latch 18. By way of example, the latch can have a sliding surface leading to a latching end of the latch 18, along which the first lever 14 slides in the event of a corresponding temperature decrease. Alternatively, the latch could also be configured to be readily movable, such that the upper end of the latch 18 in FIG. 2 readily moves toward the right if the first lever 14 slides along the sliding surface of the latch 18. If the temperature is cooled to a temperature below the first limit temperature, which can be −15° C., for example, the first lever 14 moves completely past the latch and reaches a snap-in position on the latch 18. There it latches in place irreversibly and cannot return to its initial position shown in FIG. 1a even if a temperature increase subsequently takes place.

The second lever 16 is configured to flex in the opposite direction to the first lever 14 if the temperature changes. The second lever 16 thus flexes downward into the position shown in FIG. 1b in the event of cooling. In this case, the first lever 14 and the second lever 16 are embodied relative to one another in such a way that the first lever 14 can pass the second lever if the first lever 14 has not yet latched in place at the latch 18. In this regard, the movements of the first lever 14 and of the second lever 16 in opposite directions can be coordinated with one another in order to make it possible for said levers to move past one another, wherein in particular the lengths of the first and second levers can be correspondingly coordinated with one another. FIG. 1b thus shows the activated MEMS structure.

Figure 1C:
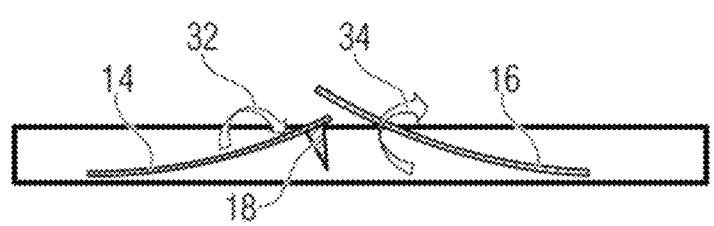

If heating of the MEMS structure then takes place proceeding from the state shown in FIG. 1b, the first lever has the tendency to flex back downward, as is shown by an arrow 32 in FIG. 1c. It latches in place at the latch 18 in the process. In the event of this temperature increase, the second lever 34 has the tendency to flex upward, as is shown by an arrow 34 in FIG. 1c. If the temperature exceeds a second limit temperature, the second lever 16 passes the first lever 14 from the bottom upward. The second limit temperature can indicate a threshold value cooling temperature, such that an exceedance thereof can indicate a contravention of a permissible cooling range. The second limit temperature can thus be an upper limit of a specific cooling range in which a product to which the MEMS structure can be fitted is supposed to be after cooling below the first limit temperature. The second limit temperature can be −10° C., for example. In the example shown, the second lever 16 can be embodied as longer and stronger than the first lever 14 in order to enable the second lever 16 to pass the first lever if it flexes upward. In this regard, it should be noted that the length ratios of the levers with respect to one another are illustrated in an exaggerated manner in FIGS. 1a-1d in order to elucidate the functionality. FIG. 1c thus shows the state after a contravention of the limit cooling temperature has taken place.

Figure 1D:
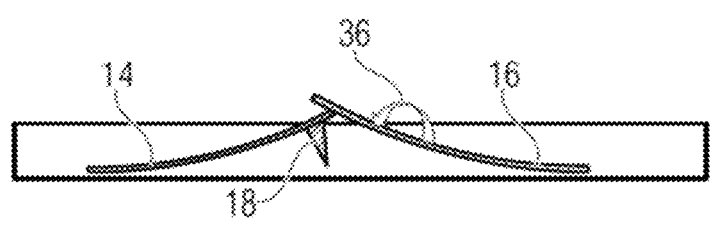

If, proceeding from the state shown in FIG. 1c, renewed cooling subsequently takes place, as shown by an arrow 36 in FIG. 1d, the second lever 16 latches in place at the first lever 14, and in particular at the section 14y thereof. The second lever 16 cannot return to its initial position even if the temperature is reduced again below the first limit value. Consequently, by reading out the state that the second lever 16 has latched in place at the first lever 14, it can be reliably identified that the cold chain was interrupted, i.e. that heating above the first limit temperature took place.

The thermal behavior of the first lever 14 and of the second lever 16 are correspondingly designed to achieve the functionality set out. In order to pass the latch 18, the first lever 14 can flex. The second lever 16 can correspondingly flex in order to pass the first lever 14 from the bottom upward.

The latched position of the first lever 14 can be detected electrically, e.g. by measuring the electrical conductivity with respect to the latching structure 18. The latched position of the second lever 16 can be detected by detecting the electrical conductivity between the levers 14 and 16, or by detecting the electrical conductivity between the second lever 16 and the latch 18 (to which the second lever 16 is connected via the first lever 14).

Figure 5A:
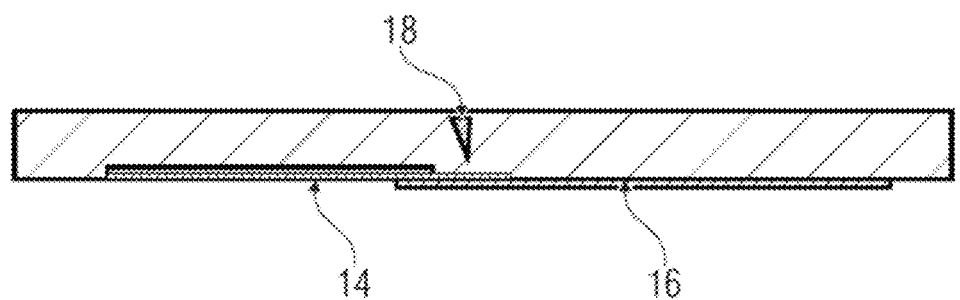
FIGS. 5a and 5b show schematic illustrations for elucidating an alternative example of a MEMS structure.
Figure 5B:
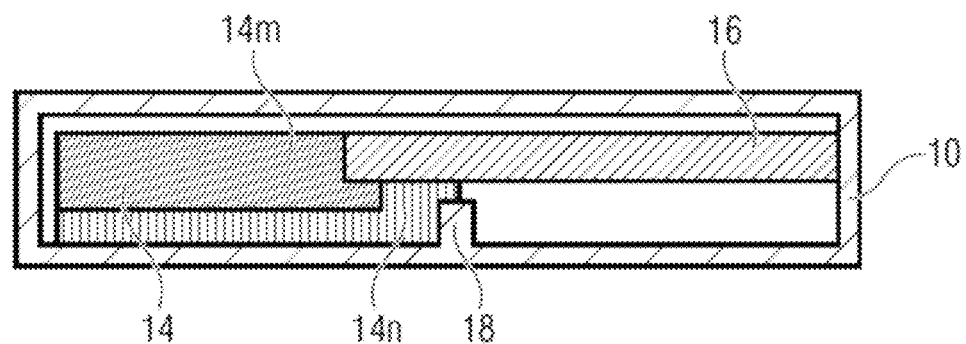

In an alternative example, the second lever 16 can be produced somewhat below the first lever 14, as is shown in FIG. 5a. As is shown in FIG. 5b, in this example, the first lever 14 can have a first, shorter section 14m and a second, longer section 14n. The shorter section 14m forms the second section, at which the second lever 16 latches in place. The longer section 14n forms the first section, which latches in place at the latch 18. In this case, the second lever 16 can be configured in such a way that its intrinsic stress at room temperature is insufficient to move the first lever 14 upward. The first lever 14 can be embodied as mechanically stronger than the second lever 16. Furthermore, the second lever 16 can additionally be mechanically fixed during production, wherein the mechanical fixing is only released in an additional further processing step in order to free the second lever 16. By way of example, this can be carried out by means of etching free by means of HF acid or removal of $SiO_2$. It is only if the first lever 14 moves upward or has latched in place in the latch 18 on account of cooling that the second lever 16 can yield to its intrinsic stresses produced during production and move upward in the event of heating, analogously to the above description of FIG. 1c. In the event of cooling, an intrinsic stress that builds up in the first lever 14 in turn has the effect that said first lever moves upward, while at the same time there is a decrease in the intrinsic stress of the second lever upward.

In the example shown in FIGS. 5a and 5b, the first lever 14 is produced with a short side 14m and a long side 14n. Said first lever can furthermore be mechanically stronger than the second lever 16. In the example shown with reference to FIGS. 1a-1d as well, the first lever 14 can have a corresponding configuration. In such examples, a flexure of the first lever 14 can thus take place in the event of desired, sufficiently deep cooling, such that the long side 14n of the first lever 14 passes the latch, wherein a flexure of the second lever 16 downward furthermore takes place. The deformation characteristic of the second lever 16 can be fashioned in such a way that the flexure of the second lever in the event of cooling makes it possible to pass the first lever 14 for example in the case of the maximum upper deflection thereof. In this case, the two levers pass one another. If heating then takes place, the first lever 14 cannot return owing to the latch 18 and the second lever 16 flexes, passes the first lever 14 and latches in place at the first lever 14. In the event of subsequent cooling, the second lever 16 can no longer go past the first lever 14, and so it can be identified that temporary heating has taken place.

Figure 3:
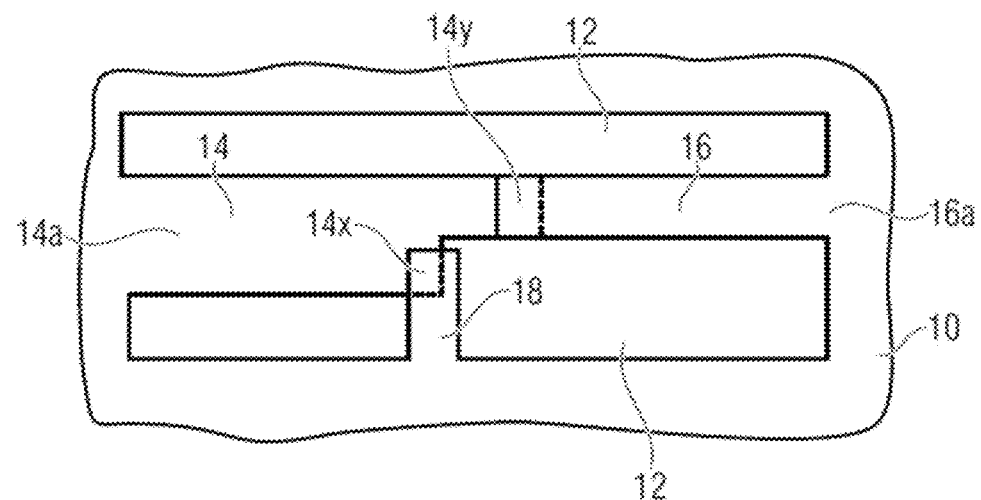
FIG. 3 shows a schematic plan view of an alternative example of a MEMS structure.

FIG. 3 shows a schematic plan view of a further alternative example. In the example shown in FIG. 3, the first lever 14 likewise has a longer section and a shorter section. However, now the first section 14x, which latches in place at the latch 18, is the shorter section, while the section 14y, at which the second lever latches in place, is the longer section. In examples, the first and second sections of the first lever can thus have identical or different lengths in order to obtain the desired functionality.

Figure 6:
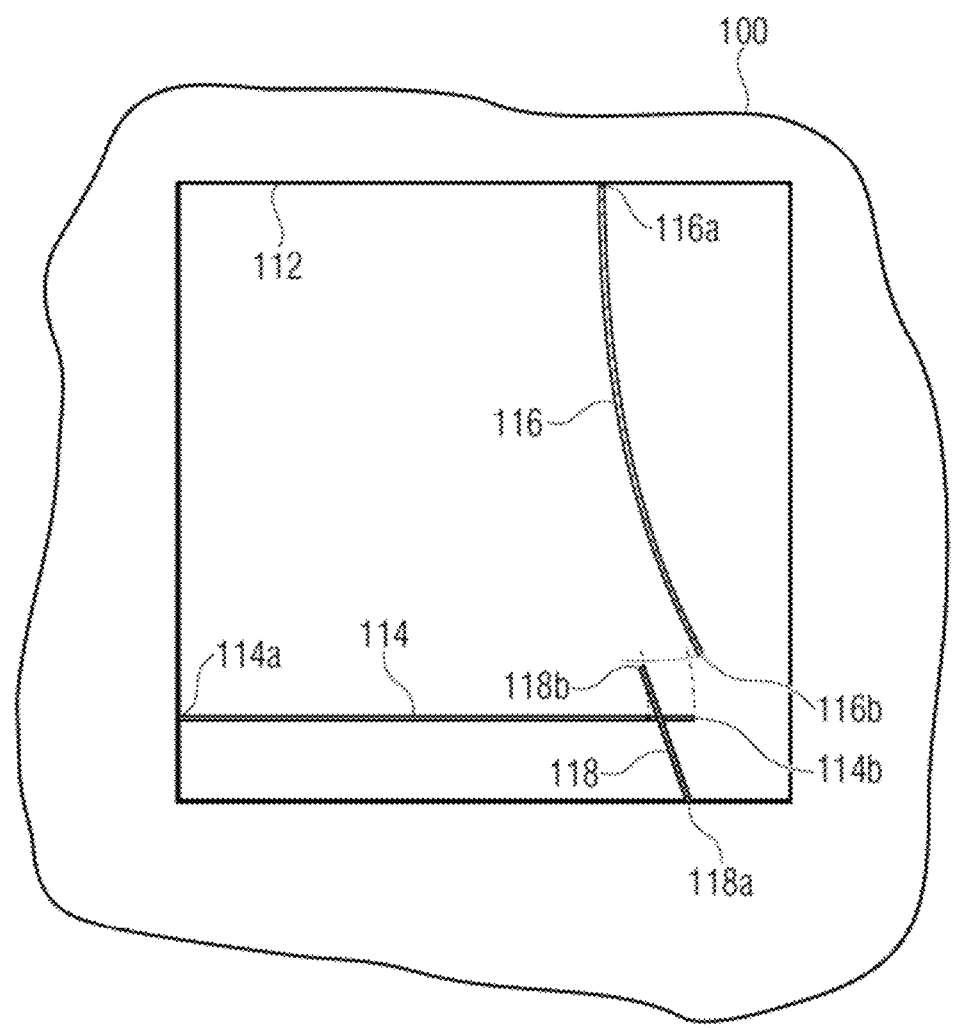
FIG. 6 shows a schematic illustration of one example of a MEMS structure, wherein the first and second levers are configured to move in a plane parallel to a substrate plane.

In the examples described, the first and second levers are each designed to flex in a direction perpendicular to the substrate plane of the substrate 10 in which the MEMS structure is formed. In alternative examples, the first and second levers can be designed to flex in a direction parallel to a substrate plane of the substrate in which the MEMS structure is formed. FIG. 6 schematically shows a substrate 100 having a cutout 112, in which a first lever 114, a second lever 116 and a latch 118 are formed. The first lever 114 is fixed to the substrate 100 at a first end 114a, the second lever 116 is fixed to the substrate 100 at a first end 116a, while second ends 114b and 116b of the first and second levers 114, 116 are movable. The latch 118 is likewise embodied in the form of a short lever, wherein a first end 118a thereof is fixed to the substrate 100 and a second end 118b thereof is movable, as will be discussed below. FIG. 6 shows a schematic plan view of the substrate, wherein the levers 114 and 116 and also the latch 118 are movable in the substrate plane, i.e. the plane of the drawing.

The first lever 114 and the second lever 116 are once again configured to have different intrinsic stresses at different temperatures and hence to flex, for example in the event of temperature changes, as will be discussed below. For this purpose the levers once again can comprise different material layers, as was explained above with reference to FIGS. 4a and 4b, although here the layers are not arranged above and below one another (i.e. alongside one another in the thickness direction), but rather alongside one another in plan view (i.e. alongside one another in the width direction), in order to achieve the corresponding functionality.

FIG. 6 shows a MEMS structure during or after production at room temperature, wherein the first lever 114 is in a neutral state, while the second lever 116 is in the illustrated bent state on account of intrinsic stresses built up during production. As is shown in FIG. 6 the first lever 114 and the second lever 116 can be arranged substantially perpendicular to one another if both were in the non-flexed state. In other examples, the first and second levers can be arranged at some other angle, different than 180°, with respect to one another. In examples, the angle in the non-deflected state of the two levers can lie in a range of 60° to 120° or in a range of 75° to 105°. Since, in the example shown in FIG. 6, the different material layers of the levers are to be arranged alongside one another it is possible that production of such structures is more difficult compared with those in which the levers are designed to flex in a direction perpendicular to a substrate plane.

FIG. 7a schematically shows a plan view of the first lever 114, the second lever 116 and the latch 118 at different temperatures $T_0$, $T_1$, $T_2$, $T_3$. In this case, the first lever 114 is configured to flex in the direction of the arrow 130 in the event of temperature cooling. The second lever 116 is configured to flex in the direction of the arrow 132 in the event of cooling. FIG. 7b shows a schematic cross-sectional view in the substrate plane. The first lever comprises two parts, an upper, longer part and a lower, shorter part. The upper, longer part extends as far as a first free end 114b1 and the lower, shorter part extends as far as a second free end 114b2. The two parts can be connected to one another. The first lever 114 is fixed to the substrate 100 at the first end 114a of the said first lever. A thickness direction D (in the thickness direction of the substrate) and a length direction L are once again shown schematically by arrows in FIG. 7b.

The lever 114 can have the tendency to move according to the arrow 130 (upward in the drawing) actively as a result of thermal stresses in the event of cooling. By way of example, the longer part of the lever 114 can be configured to bring about such a flexure. The shorter part of the first lever 114 can be embodied as a thermally passive element, wherein no influencing of the geometry on account of temperature changes thus takes place. Alternatively, both parts of the first lever 114 can be understood as a lever having the tendency to move in the direction of the arrow 130 actively as a result of thermal stresses in the event of cooling.

The second lever 116 is fixed at its first end 116a (at the upper end according to the drawing). This lever has the tendency to move in the direction of the arrow 132 (toward the left according to the drawing) actively as a result of thermal stresses in the event of cooling. The latch 118 is embodied as a thermally passive lever and is fixed to the substrate 100 at its end 118a (in the lower end in the drawing). A contact element 140 for an electrical contact with the second lever 116 can be provided. By way of example, the contact element 140 can be arranged in such a way that the second lever 116 has contact with the contact element 140 if it has latched in place at the first lever 116.

As can be discerned in FIG. 7b, the first lever 114 has a maximum thickness perpendicular to the substrate plane (height) which is greater than a maximum thickness of the second lever 116. A section 114x of the first lever which latches in place at the latch 118 is arranged in a lower thickness region of the first lever 114. A second section 114y of the first lever 114, at which the second lever 116 latches in place, is arranged in an upper thickness region of the first lever 114. The lower thickness region of the first lever 114 constitutes a first thickness region and the upper thickness region of the first lever 114 constitutes a second thickness region. The latch 118 extends below the second thickness region of the first lever 114. The longer part of the first lever 114 can thus move over the latch 118 without the latch 118 disturbing the movement of the upper part of the first lever 114. In the schematic side view in FIG. 7b, the lever 114 has latched in place by the section 114x at the latch 118 and the second lever 116 has latched in place at the section 114y of the first lever 114.

The respective elements of the MEMS structure shown at respective temperatures $T_0$ to $T_3$ in FIG. 7a. The first lever 114 is shown in a first position at the temperature $T_0$, in a second position at the temperature $T_1$ and in a third position at temperatures $T_2$, $T_3$. The second lever 116 is shown in a first position at the temperature $T_0$, in a second position at the temperatures $T_1$, $T_2$ and in a third position at the temperature $T_3$. In this case, the temperatures $T_0$ to $T_3$ represent a temperature profile. The temperature $T_0$ can represent a temperature during production, for example 25° C. The temperature $T_1$ can represent a temperature after cooling, for example 0° C. or −10° C. The temperature $T_2$ can represent a temperature after cooling to an activation temperature, i.e. a first limit temperature, for example −15° C. The temperature $T_2$ can represent a second limit temperature, which is higher than the first limit temperature, for example −5° C. or −10° C. The temperatures indicated herein should be understood by way of example and offer a configurable design criterion according to the desired function.

During or after production at the temperature $T_0$, the first lever 114 is in the neutral position and the second lever 116 is in a deflected position on account of intrinsic stresses 116. The latch 118 is at the correspondingly designated position at the temperature $T_0$. The first lever 114 is designed to move in the direction of the arrow 130 in the event of cooling to the temperature $T_1$, and the second lever 116 is designed to move in the direction of the arrow 132 into the position shown in the event of such cooling, in which position the second lever 116 can contact the contact element 140. In this case, the free ends 114b and 116b of the levers move toward one another, but the levers are designed in such a way that they do not obstruct one another during this movement. As is indicated in FIG. 7a, the shorter end 114b2 of the first lever 114 begins to deflect the latching lever 118 slightly laterally (toward the right according to the drawing) in the direction of that position of said latching lever 118 which is designated by $T_2$. If an increase in the temperature takes proceeding from these positions designated by $T_0$ and $T_1$ in FIG. 7a, the lever end 114b2 can move along the curve K1, the lever end 114b1 can move along the curve K2 and the lever end 116b can move along the curve K3 once again in the direction of the initial position. The temperature sequence $T_0$-$T_1$-$T_0$ would accordingly be a reversible/repeatable process as long as cooling below the activation temperature does not take place.

If further cooling to the activation temperature $T_2$ takes place, then the second lever 116 remains in its position. This position is fashioned in such a way that the lever 114 can move without restriction right into the position designated by $T_2$, $T_3$ in FIG. 7a. In this case, the shorter end 114b2 of the first lever 114 presses the latching lever 118 counter to its elasticity toward the right until it attains the position shown upon the activation temperature being attained, in which position it has moved past the latching lever 118, such that the latter, on account of its elasticity, can spring back into the initial position corresponding to the position designated by $T_0$. To put it another way, the latching lever 118 releases the mechanical stress built up during the flexure toward the right and springs back into its initial position. As a result, the first lever 114 latches in place with the latch 118 even if heating to a higher temperature that would bring about a movement of the first lever 114 counter to the arrow 130 subsequently takes place. The second lever 116 can touch the lever A in this position, which may be expedient for electrically tapping off the state.

If, proceeding from the state in which an activation took place, there then occurs a contravention of the critical minimum temperature (an exceedance of the second limit temperature), which can be for example −10° C. or −5° C., the first lever 114 is restricted in its freedom of movement downward by the latch 118 and cannot leave the latched position. To put it another way, the first lever 114 is irreversibly latched in place at the latch 118. The second lever 116 moves counter to the direction of the arrow 132 in the event of heating, wherein the free end 116b follows the trajectory K3. In this case, the second lever 116 is designed in such a way that the long end 114b1 of the first lever 114 can readily be flexed downward. If the second limit temperature is exceeded, the second lever 116 passes the position designated by $T_3$ and the first lever 114 snaps upward on account of its mechanical stress built up during the flexure by the lever 116. Even if repeated cooling to the activation temperature $T_2$ takes place after such heating, the lever 116 cannot return to its position $T_1$, $T_2$ since it is blocked by the first lever 114. The second lever 116 thus latches in place at the end 114b1 or the section 114y of the first lever 114. In this case, the first lever 114 and the second lever 116 are to be designed in such a way that the second lever 116 remains latched in place at the first lever 114 even if the first lever 114 is deflected further in the direction of the arrow 130 in the event of further cooling.

Figure 9:
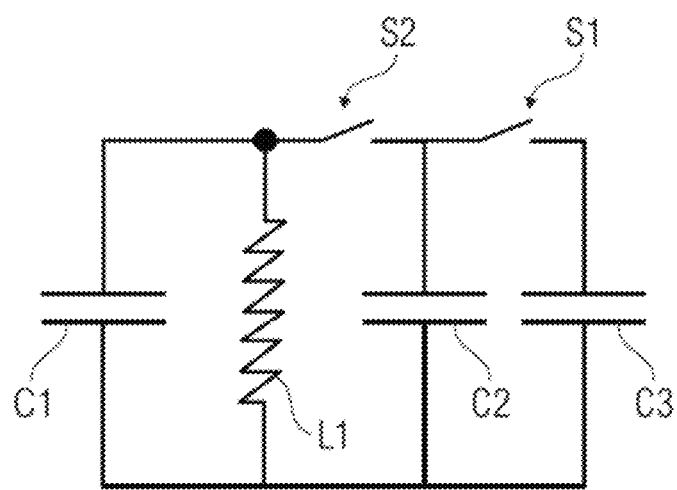
FIG. 9 shows a schematic illustration of a circuit whose property is able to be altered as a result of latching in place of the first and/or second lever.

In examples of the present disclosure, the latching in place of the second lever at the first lever can be detected by optical methods. In examples, the position of the levers can be utilized as an electrical switch, such that the status of the MEMS structure or of the MEMS element can be electronically interrogated. By way of example, if the second lever has latched in place at the first lever, a bit of an RFID unit can be switched, such that this state can be detected externally. Alternatively, a passive RF resonant circuit can be switched by the second and/or first lever. By way of example, FIG. 9 shows an RF resonant circuit having three capacitors C1, C2 and C3 and an inductance L1. A first switch S1 of the resonant circuit could be closed if the second lever has latched in place at the first lever. In addition, a further switch S2 can be provided, which is closed if the first lever latches in place at the latch. It is thus possible to detect different states by means of different resonant frequencies of the passive RF resonant circuit. Although different capacitances are switched in accordance with FIG. 9, it is likewise possible to switch a different number of turns for an RFID resonant circuit excited by radio in combination with a small capacitance.

In the example shown in FIG. 7a, in which a contact 140 is additionally provided, the following states can be detected, for example:

$T>T_1$: lever 116—contact element 140 open, lever 114—latch 118 open, lever 114—lever 116 open: status 000, unused, reversible;

$T<T_1$: lever 116—contact element 140 closed, lever 114—latch 118 closed, lever 114—lever 116 open: status 110, cooled, but reversible;

$T<T_2$: lever 116—contact element 140 closed, lever 114—latch 118 open, lever 114—lever 116 closed: status 101, cooled and cold chain in order.

Subsequently: $T>T_1$: lever 116—contact element 140 open, lever 114—latch 118 closed, lever 116—lever 114 closed: status 011, active contravention of the cold chain detected;

Subsequently: $T<T_2$: lever 116—contact element 140 open, lever 114—latch 118 open, lever 116—lever 114 closed: status 001, past contravention of the cold chain detected.

In order to make possible a corresponding electronic detection, the respective levers can be embodied with a corresponding conductivity and be connected to corresponding circuit structures. In examples of the present disclosure, in addition to the first and second levers and the latch, contact elements can be provided in order to detect respective positions of the levers. A contact element can be provided, for example, with which the second lever comes into contact if it flexes on account of a flexure as a result of the change in the parameter in the second direction and has not latched in place at the first lever.

Additionally or alternatively, with respect to the contact elements and switches described, further contact elements and switches can be provided in order to read out respective states or statuses.

Generally, in examples of the present disclosure, the respective levers can be configured to achieve a traditional bimetal effect, as has been described above with reference to FIGS. 4a and 4b. For this purpose, by way of example, regions of a lever consisting of a polycrystalline semiconductor material, for example silicon, can be implanted in order to achieve a bimetal effect. By way of example, a high p-type doping can achieve the result that a lever flexes in the direction in which the implantation was formed in the event of a temperature increase, while it flexes in the opposite direction in the event of a temperature decrease. Accordingly, corresponding levers which move in or parallel to a substrate plane can also be implemented by implanted and non-implanted regions being arranged alongside one another in the width direction of the levers.

Figure 8:
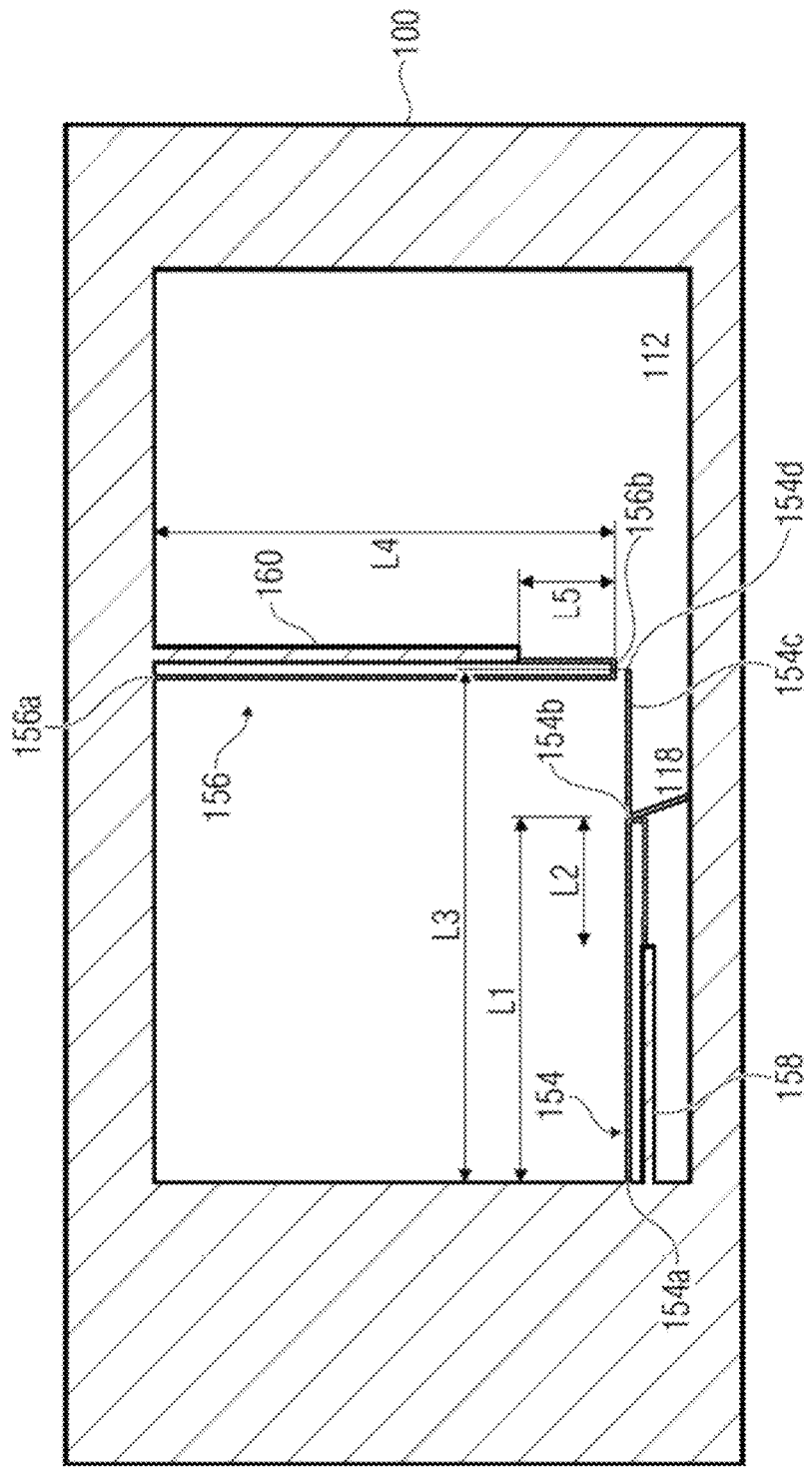
FIG. 8 shows a schematic illustration for elucidating possible implementations of levers.

FIG. 8 schematically shows a further possibility of how the first and second levers can be implemented in order to achieve a deflection of levers in the substrate plane. FIG. 8 schematically shows a plan view of a substrate 100 having a cutout 112. A first lever 154, a second lever 156 and a latch 118 are formed in the cutout 112.

A first end 154a of the first lever 154 is fixed to the substrate 100. The first lever 154 has four elements. A first longer element having a length L1 extends between the end 154a and an intermediate section 154b. A second shorter element having the length L2 extends between the intermediate section 154b and a rigid carrier element 158. A third element is a connecting web that connects the first longer element and the shorter second element of the lever 154 (in the direction from top to bottom in FIG. 8). Furthermore, the lever 154 has, as fourth element, an elongated latching arm 154c extending as far as a free end 154d of the lever 154. The latching arm 154c has a length L3.

The second lever 156 is fixed to the substrate 100 at a first end 156a of said second lever. The second lever 156 has three elements, a first longer element having a length L4, which extends between the fixed end 156a and a free end 156b of the first lever, a second shorter element having a length L5, which extends between the free end 156n and a rigid connection piece 160 fitted to the substrate 100 and has a length L5, and a third element formed by a short connecting web that connects the longer element having the length L4 and the shorter element having the length L5 of the second lever 156 to one another (and extends in the horizontal direction in FIG. 8).

In FIG. 8, the white regions should be understood as regions without material. The coefficient of thermal expansion of the levers 154, 156, or of the layers in which the levers are formed, is increased on account of corresponding doping in relation to the substrate. In the event of a temperature change, both the length of layer elements of the levers and the total length thereof can change proportionally to the temperature change. The thermal length change of the layer elements in which the levers are formed is greater than that of the substrate. Since in each case a long and a short element of the respective levers are connected to one another, a flexure of the levers 154 and 156 arises in the event of a temperature change. As is indicated in FIG. 8, the connecting web that connects the long part and the short part of the lever 154 to one another can engage with the latch 118 if the lever flexes upward, whereupon the latch 118 can snap back, such that the short part of the lever 154 can latch in place at the latch, analogously to the above description of FIGS. 7a and 7b.

Figure 10:
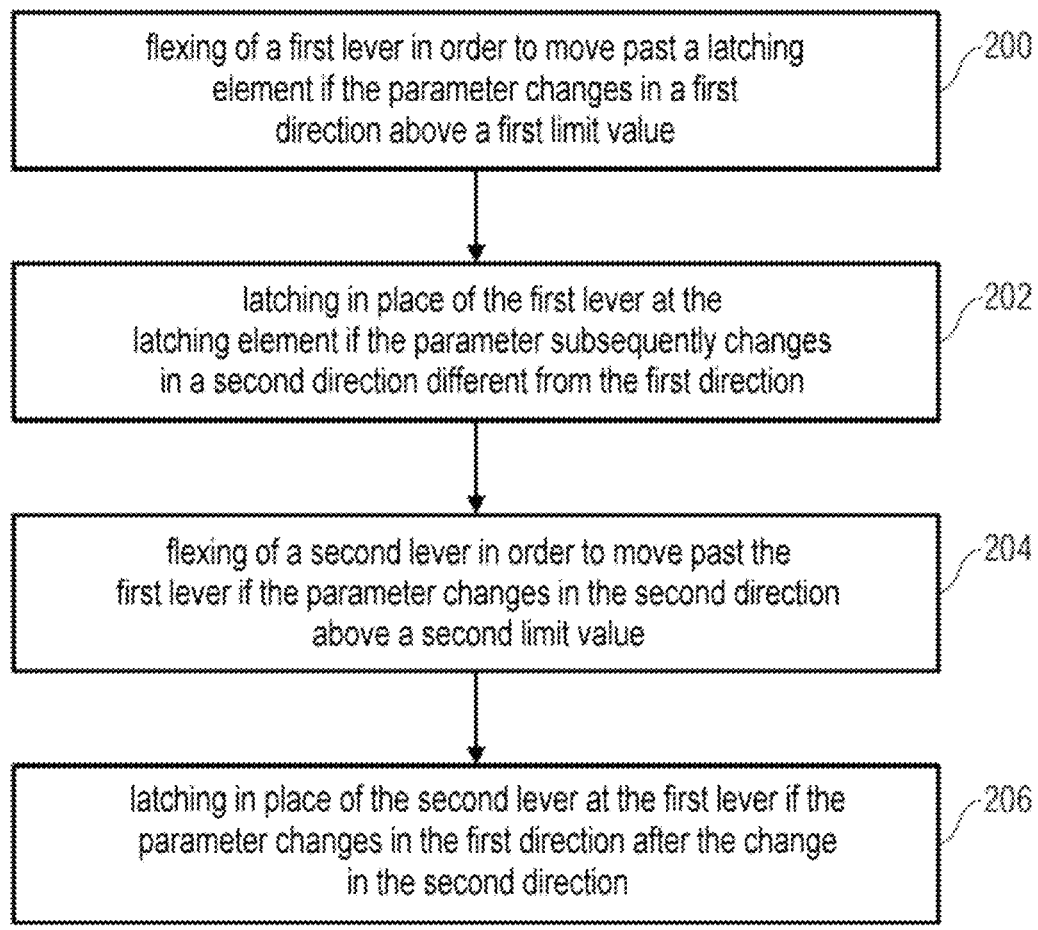
FIG. 10 shows a flow diagram of one example of a method in accordance with the present disclosure.

FIG. 10 shows a flow diagram of one example of a method in accordance with the present disclosure. At 202, a first lever is flexed in order to move past a latch if the parameter changes in a first direction above a first limit value. At 204, the first lever latches in place at the latch if the parameter subsequently changes in a second direction different than the first direction. At 206 the second lever flexes in order to move past the first lever if the parameter changes in the second direction above a second limit value. At 208, the second lever latches in place at the first lever if the parameter changes in the first direction after the change in the second direction.

Examples of the present disclosure thus provide MEMS structures and methods which make it possible to detect individual events, such as e.g. the contravention of a cold chain. The event brings about a permanent change in a mechanical structure, which can then be read out optically or electrically. In examples, a bit of an RFID tag can be switched as a result, such that a value read out from the tag depends on whether or not the event was detected. In examples, the parameter is the temperature, wherein the levers are configured, as described, to flex on account of temperature changes. In other examples, provision can be made of other structures for deforming MEMS lever elements, which react for example with moisture, with x-ray radiation, with chemicals, with gases, etc., in order to flex the lever elements. As a result, examples of the disclosure can be designed to detect different events than instances of temperature being exceeded, for example excessively high moisture, excessively high x-ray irradiation, excessively high chemical loading, etc. In other examples, the levers can be configured to flex on account of accelerations, such that irreversibly excessively high accelerations can be detected. In furthermore alternative examples, the response behavior of a surface acoustic wave filter can be changed as a result of the irreversible latching in place of the second lever at the first lever, such that the detectable property is the changed response behavior of the surface acoustic wave filter.

Examples of the present disclosure provide a parameter-activated dual locking mechanism that is activated by temperature, for example. The MEMS structures or elements described can be used in RFID tags, for example, in order to detect the interruption of a cold chain by means of their being used as a mechanical switch on the RFID tag, or in order to set or to change a bit of the RFID tag. The end position of the second lever and/or of the first lever can be detected electrically by detecting the electrical conductivity with respect to the latch or between the first and second levers. Examples make possible non-contact read-out by a reader or else by a cellular phone.

Generally, in examples, the first lever passes the latch if the first lever moves in a first direction, and latches in place at the latch if it moves in an opposite second direction. In the same way, the first lever passes the second lever if it moves in a first direction, and latches in place in the second lever if it moves in a second opposite direction. The configuration of the levers and of the latch, such as e.g. material composition, arrangement thereof with respect to one another and dimensions thereof, and also the response behavior of the levers to changes in the parameter are coordinated with one another in order to obtain the functionalities described. Examples of corresponding latchs have been described above. It is evident, however, that latchs can also be implemented in a different way as long as the first lever can pass the latch in the event of a movement in one direction, while it latches in place at the latch in the event of a movement in the opposite second direction.

In examples, the latch is thermally passive, such that no direct influencing of the geometry of the latch takes place on account of temperature changes, while the first lever and the second lever are embodied as thermally active elements.

Examples of the present disclosure thus make possible a passive detection of events that concern physical parameters, that is to say, without energy input or heating of the MEMS structure as a result of current flow.

Although some aspects of the present disclosure have been described as features in the context of a device, it is clear that such a description can likewise be regarded as a description of corresponding method features. Although some aspects have been described as features in association with a method, it is clear that such a description can also be regarded as a description of corresponding features of a device or of the functionality of a device. In this regard, it should also be pointed out, in particular, that the features of the dependent device claims can correspondingly also be reworded as dependent method claims.

In the detailed description above, in some instances different features have been grouped together in examples in order to rationalize the disclosure. This type of disclosure ought not to be interpreted as the intention that the claimed examples have more features than are expressly indicated in each claim. Rather, as represented by the following claims, the subject matter can reside in fewer than all features of an individual example disclosed. Consequently, the claims that follow are hereby incorporated in the detailed description, wherein each claim can be representative of a dedicated separate example. While each claim can be representative of a dedicated separate example, it should be noted that although dependent claims refer back in the claims to a specific combination with one or more other claims, other examples also comprise a combination of dependent claims with the subject matter of any other dependent claim or a combination of each feature with other dependent or independent claims. Such combinations shall be encompassed, unless an explanation is given that a specific combination is not intended. Furthermore, the intention is for a combination of features of a claim with any other independent claim also to be encompassed (for example of the dependent device claims with the independent method claim), even if this claim is not directly dependent on the independent claim.

The examples described above are only illustrative of the principles of the present disclosure. It should be understood that modifications and variations of the arrangements and of the details described are obvious to those skilled in the art. Therefore, the intention is for the disclosure to be limited only by the appended patent claims and not by the specific details set out for the purpose of describing and explaining the examples.

The invention claimed is:

1. A MEMS structure, comprising:
    a latch;
    a first lever designed to move past the latch as a result of flexure in the event of a change in a parameter in a first direction, and to latch in place at the latch if a change in the parameter in a second direction different than the first direction subsequently takes place;

a second lever designed to move past the first lever as a result of flexure in the event of the change in the parameter in the second direction, and to latch in place at the first lever if a change in the parameter in the first direction takes place after the change in the parameter in the second direction, and wherein the latch is formed as a separate element from the first level and from the second lever.

2. The MEMS structure as claimed in claim 1, wherein the parameter is temperature, and wherein the first lever and the second lever each comprise at least two material layers designed to flex in the event of changes in the temperature.

3. The MEMS structure as claimed in claim 2, wherein the first lever is designed to move past the latch as a result of flexure in the event of cooling below a first limit temperature and to latch in place at the latch, and the second lever is designed to move past the first lever in the event of subsequent heating above a second limit temperature and to latch in place at the first lever.

4. The MEMS structure as claimed in claim 1, wherein the first lever has a first section and a second section, the first section is designed to latch in place at the latch, and the second lever is designed to latch in place at the second section of the first lever.

5. The MEMS structure as claimed in claim 4, wherein the first and second levers are designed to flex in a direction perpendicular to a substrate plane of a substrate in which the MEMS structure is formed.

6. The MEMS structure as claimed in claim 4, wherein the first and second levers are designed to flex in a direction parallel to a substrate plane of a substrate in which the MEMS structure is formed.

7. The MEMS structure as claimed in claim 5, wherein:
the first lever and the second lever each have a length and a width,
a first end in the length direction of the first and second levers is in each case secured to the substrate,
a second end in the length direction of the first and second levers in each case face one another,
the first lever has a width that is greater than a width of the second lever,
the first section is arranged in a first width region of the first lever, and
the second section is arranged in a second width region of the first lever.

8. The MEMS structure as claimed in claim 7, wherein, in a plan view of the substrate, the latch does not extend beyond the first width region.

9. The MEMS structure as claimed in claim 6, wherein:
the first lever and the second lever each have a length and a thickness,
a first end, in the length direction, of the first and second levers is in each case secured to the substrate,
a second end, in the length direction, of the first and second levers in each case face one another, the first lever has a thickness that is greater than a thickness of the second lever,
the first lever and the second lever are arranged at an angle with respect to one another,
the first section is arranged in a first thickness region of the first lever, and
the second section is arranged in a second thickness region of the first lever.

10. The MEMS structure as claimed in claim 9, wherein the latch extends below the second thickness region of the first lever.

11. The MEMS structure as claimed in claim 8, wherein the first and second sections of the first lever have identical or different lengths.

12. The MEMS structure as claimed in claim 1,
wherein the latch has an elastic latching lever, wherein a free end of the latching lever is deflectable from an initial position by the first lever if the first lever moves past the latch as a result of the change in the parameter in the first direction, and its elasticity brings the latching lever into the initial position again if the first lever has moved past, such that the first lever latches in place on the free end of the latching lever if the change in the parameter in the second direction different than the first direction subsequently takes place.

13. The MEMS structure as claimed in claim 1, wherein the latch has a sliding surface which leads to a latching end of the latch and along which the first section of the first lever slides if the first lever moves past the latch in the event of the change in the parameter in the first direction, wherein the first lever latches in place at the latching end if the change in the parameter in the second direction different than the first direction subsequently takes place.

14. The MEMS structure as claimed in claim 1, further comprising:
an electrical circuit, wherein a detectable property of the electrical circuit is altered as a result of the second lever latching in place at the first lever.

15. The MEMS structure as claimed in claim 14, further comprising:
an electrical switch that is closed if the second lever latches in place at the first lever.

16. The MEMS structure as claimed in claim 14, wherein the electrical circuit is a radio-frequency resonant circuit and the detectable property is the resonant frequency of the radio-frequency resonant circuit, or wherein the electrical circuit comprises a surface acoustic wave filter, wherein the detectable property is a changed response behavior of the surface acoustic wave filter.

17. An RFID tag comprising a MEMS structure as claimed in claim 1, wherein a bit of the RFID tag is irreversibly switched if the second lever latches in place at the first lever.

18. The MEMS structure as claimed in claim 1, wherein in the event of the change in the parameter in one of the first or second direction, the second lever is configured to flex in a direction opposite that of the first lever.

* * * * *